United States Patent
Banzhaf et al.

(10) Patent No.: US 6,567,971 B1
(45) Date of Patent: May 20, 2003

(54) CIRCUIT SYNTHESIS METHOD USING TECHNOLOGY PARAMETERS EXTRACTING CIRCUIT

(75) Inventors: Walter H. Banzhaf, Richardson, TX (US); Aubin P. J. Roy, Hull (CA); Stephen K. Sunter, Nepean (CA)

(73) Assignee: LogicVision, Inc., San Jose, CA (US)

( * ) Notice: Subject to any disclaimer, the term of this patent is extended or adjusted under 35 U.S.C. 154(b) by 0 days.

(21) Appl. No.: 10/021,810

(22) Filed: Dec. 20, 2001

(51) Int. Cl.[7] .............................................. G06F 17/50
(52) U.S. Cl. ................. 716/18; 716/1; 716/6; 703/14
(58) Field of Search ................... 716/1–18; 703/13–15, 703/18–19

(56) References Cited

U.S. PATENT DOCUMENTS

| | | |
|---|---|---|
| 4,980,585 A | 12/1990 | Bazes |
| 5,087,842 A | 2/1992 | Pulsipher et al. |
| 5,274,568 A | 12/1993 | Blinne et al. |
| 5,345,393 A * | 9/1994 | Ueda ........................... 716/18 |
| 5,452,225 A | 9/1995 | Hammer |
| 5,598,344 A * | 1/1997 | Dangelo et al. ............... 716/18 |
| 5,655,109 A | 8/1997 | Hamid |
| 5,768,130 A | 6/1998 | Lai |
| 5,870,308 A | 2/1999 | Dangelo et al. |
| 5,870,309 A | 2/1999 | Lawman |
| 5,898,595 A | 4/1999 | Bair et al. |
| 5,933,356 A | 8/1999 | Rostoker et al. |
| 6,012,833 A | 1/2000 | Yoshikawa |
| 6,026,219 A | 2/2000 | Miller et al. |
| 6,133,773 A | 10/2000 | Galepp et al. |
| 6,145,117 A | 11/2000 | Eng |
| 6,151,568 A * | 11/2000 | Allen et al. ................... 703/14 |
| 6,204,694 B1 | 3/2001 | Sunter et al. |
| 6,370,678 B1 * | 4/2002 | Culler ........................... 716/18 |
| 6,470,482 B1 * | 10/2002 | Rostoker et al. ............... 716/6 |

* cited by examiner

Primary Examiner—Matthew Smith
Assistant Examiner—Paul Dinh
(74) Attorney, Agent, or Firm—Eugene E. Proulx

(57) ABSTRACT

A method of synthesizing a circuit employs a technology parameter extraction circuit which is synthesized with constraints and simulated to derive values of performance parameters, and then, based on the derived values, a predetermined high-level circuit description of a second circuit is modified and then synthesized using the same constraints. Optional steps include the creation and substitution of a sub-circuit model to permit correct simulation, or substitution of an alternative sub-circuit to synthesize a second circuit that cannot otherwise be synthesized directly.

28 Claims, 7 Drawing Sheets

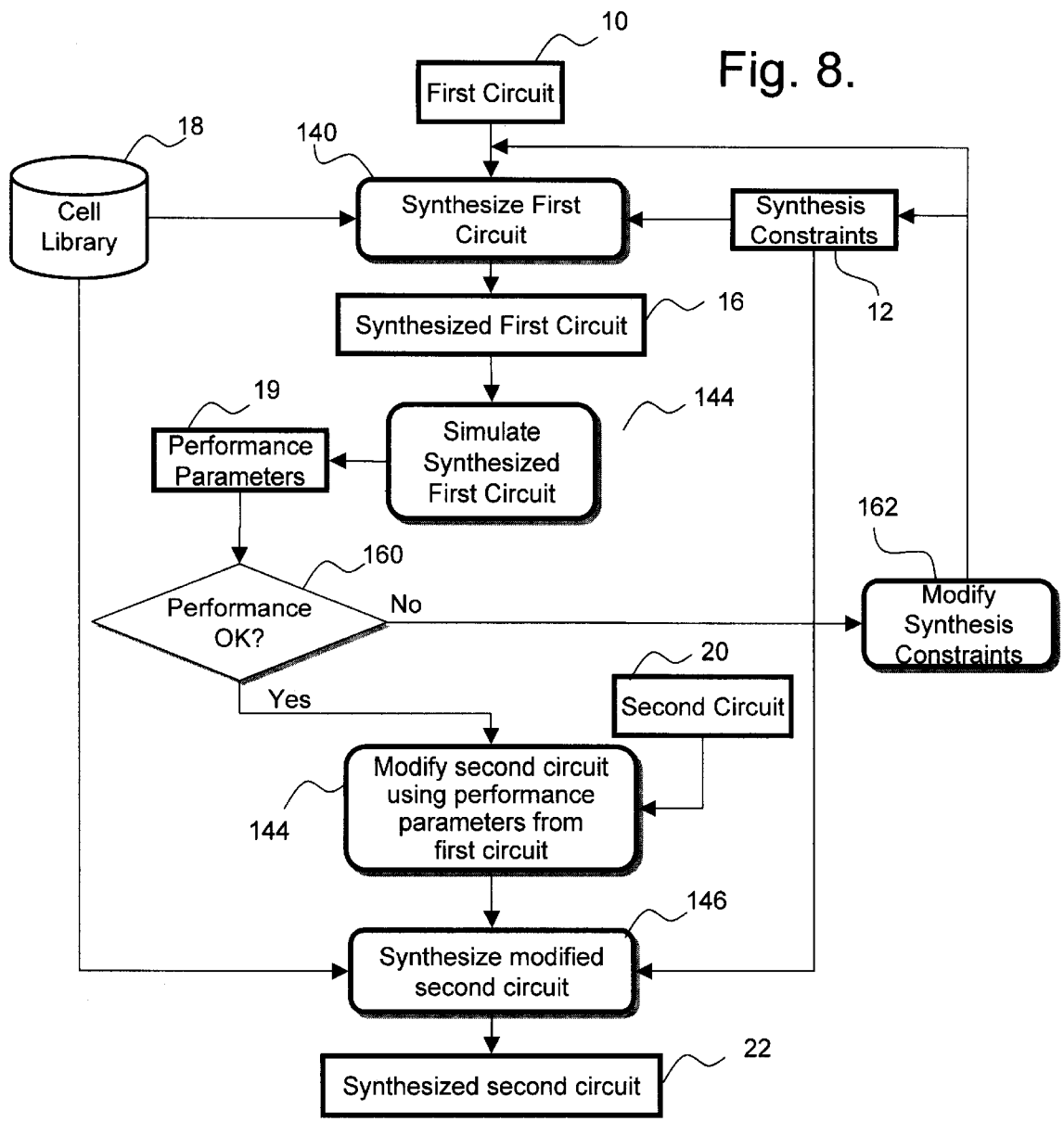

CIRCUIT SYNTHESIS METHOD USING TECHNOLOGY PARAMETERS EXTRACTING CIRCUIT

The present invention relates, in general, to integrated circuits and, more specifically, to methods of and program product for designing integrated circuits.

BACKGROUND OF THE INVENTION

A typical logic circuit design process includes the steps of writing a description of the desired circuit in a high-level hardware description language (HDL), synthesizing the circuit represented by the HDL using a library of pre-designed circuits (herein called "logic cells") from a hardware fabrication technology, including for example, NAND gates and flip-flops, simulating the resulting synthesized circuit, analyzing the synthesized circuit for timing and other characteristics using circuit simulator software and/or a circuit timing analyzers; and, if the performance of the synthesized circuit is not acceptable, modifying the HDL description and repeating the above steps.

This design process has been used by thousands of designers, for thousands of designs. Logic circuit synthesis software optimizes combinatorial and sequential logic, minimizing area and power while meeting circuit propagation delay constraints. Yet, there are functions with additional constraints, which are not presently handled by commercially available synthesis software. For example, using only an HDL description, synthesis software cannot build a logic circuit whose signal propagation delay can be adjusted in increments of less than the delay of a logic gate. Such a logic circuit is a useful building block for ring oscillators, clocks, distribution circuits, and timing measurement circuits, for example.

One way of building functions not handled by synthesis software is to have the manufacturer of the logic cells create a new logic cell to implement the function. However, this method is costly, time consuming, and not easily portable between hardware fabrication technologies.

Another approach is to write "structural HDL", a style of HDL in which the detailed logic structure of the desired function is specified in terms of sub-functions that are predictably synthesized from logic cells. These sub-functions are then tagged to indicate that the synthesis software should not attempt to optimize or change these sub-functions (for example, one commercial tool uses the key word "don't$_{13}$ touch"). This approach will work if the writer of the structural HDL knows some essential performance parameters of the sub-functions, such as signal propagation delays and output drive strength (or "drive factor"). If the designer knows which logic cells the synthesis software will use when constructing the sub-functions, he can inquire about the parameters of the pre-defined circuits. Delays, drive factors and other parameters for the pre-defined circuits are contained in synthesis and simulation models. Unfortunately, this data is generally encrypted and not available to the designer. Some modeling information for the logic cells is contained in documentation or data sheets produced by the manufacturer. However, this data is often incomplete or out of date. In spite of these obstacles, model delays and drive factors can be manually copied from data sheets and used to write structural HDL. The results typically vary due to errors in interpreting data sheets, out of date information, typographical errors, etc.

Another limitation resides in logic circuit simulator software (herein called "logic simulator"). Very small delay increments can be obtained by connecting a plurality of tristate gates in parallel and enabling all or a subset of the gates to switch in response to their data inputs. These circuits can be designed using the structural HDL plus the "don't-touch" method described earlier. However, logic simulators incorrectly simulate the delay as though only one tristate gate is switching. Transistor-level simulators will simulate the correct delay, but simulate very slowly for large circuits. Moreover, neither transistor models nor net lists of the pre-defined circuits are generally available to the logic designer.

SUMMARY OF THE INVENTION

The present invention seeks to provide a method for designing circuits to (a) allow the initial description of a circuit to be modified or adjusted to reflect hardware fabrication technology and (b) to allow modeling of circuits with software tools which are not otherwise capable of modeling the circuit.

The present invention is generally defined as a method of synthesizing a circuit, comprising synthesizing a high-level circuit description of a first circuit according to synthesis constraints and a circuit implementation technology to produce a synthesized first circuit; simulating the synthesized first circuit to derive values of performance parameters of the circuit implementation technology; modifying a high-level circuit description of a second circuit based on the derived values to produce a modified second circuit description; and synthesizing the modified second circuit description according to the synthesis constraints and a circuit implementation technology to produce a synthesized second circuit.

BRIEF DESCRIPTION OF THE DRAWINGS

These and other features of the invention will become more apparent from the following description in which reference is made to the appended drawings in which:

FIG. 8 is a flow chart illustrating further aspects of the synthesis method of the present invention.

DETAILED DESCRIPTION OF PREFERRED EMBODIMENTS

One objective of the present invention is to provide a method of extracting performance parameters from a cell library of a circuit implementation technology of interest. As previously mentioned, performance parameters, such as delays, drive factors and other parameters, for a circuit, are contained in synthesis and simulation models, which are generally encrypted and not available to the designer. Required data may be in documentation or data sheets produced by the manufacturer, but the data is often incomplete or out of date. Incorporating the data into a design HDL requires manually copying from data sheets. The results typically vary due to errors in interpreting data sheets, out of date information, typographical errors, etc. The method illustrated in FIG. 1 overcomes this problem.

Figure 1:
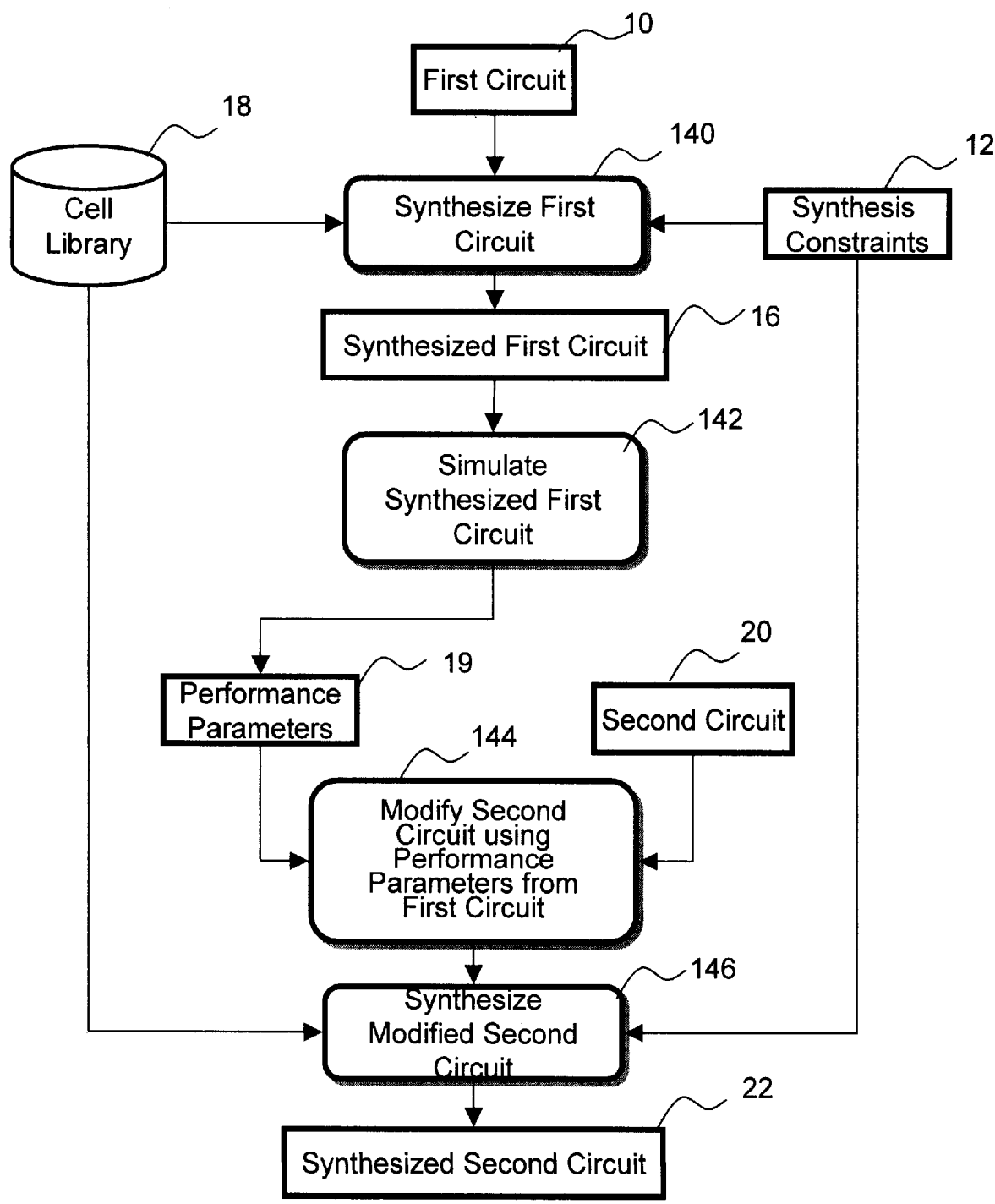
FIG. 1 is a flow chart illustrating a synthesis method according to an embodiment of the present invention.

Referring to FIG. 1, the method of the present invention generally comprises synthesizing (step 140) a first circuit 10 according to synthesis constraints 12 and circuit implementation technology 18 to produce a synthesized first circuit 16. The first circuit would typically be in the form of a high-level circuit description of a circuit which is designed for use in extracting performance parameters of circuit implementation technology 18 of interest. An example of such a circuit is described below with reference to FIG. 3 and FIG. 4. Next, the synthesized first circuit 16 is simulated (step 142) to derive values of performance parameters of interest. Next, a high-level circuit description of second circuit 20, a circuit under design, is modified (step 144) using the derived values of the performance parameters to produce a modified second circuit description. Finally, the modified second circuit description is synthesized (step 146) using the same synthesis constraints 12 which were used to synthesize first circuit 10. This produces a synthesized second circuit 22.

The method makes it possible to obtain the required data without referring to a manufacturer's documentation or data sheets to incorporate the data into a circuit under design. In addition, the same first circuit can be used many times for the same or different circuits of interest and, importantly, with any cell library of the same or different manufacturer, thereby making the method easily portable between hardware fabrication technologies. Other advantages of the method will be apparent to persons skilled in the art. Embodiments of the method may be used to handle circuits which do not simulate or synthesize correctly. The method illustrated in FIG. 5 addresses circuits which do not simulate correctly. The method illustrated in FIG. 7 addresses circuits which do not synthesize correctly.

Figure 2:
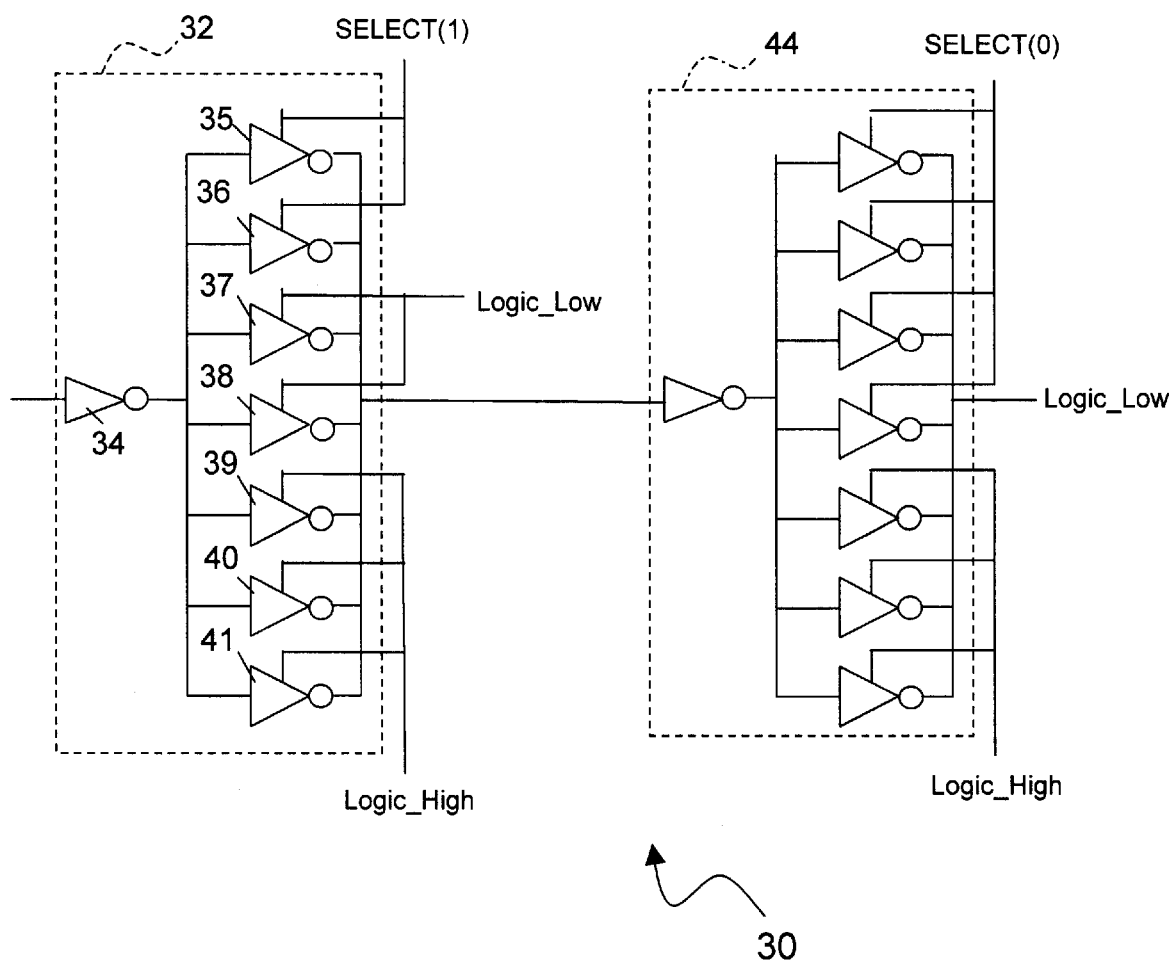
FIG. 2 is a circuit diagram of a circuit which contains functional circuitry that cannot be simulated using the prior art typical design process described earlier.

The second circuit 20 may have a sub-circuit whose model does not simulate correctly with the result that synthesized circuit 22 itself does not simulate correctly. By way of example, FIG. 2 illustrates a circuit 30 which is used as a template for building a logic circuit whose delay can be adjusted in increments that are less than the delay of a single logic gate. With that circuit, a designer can meet requirements of maximum delay, minimum delay, and delay increment over a defined set of operating conditions using one or more variations or versions of the circuit. Such a circuit can be used to incorporate into the design of a circuit, an embedded clock generator such as that described and claimed in Sunter et. al. U.S. Pat. No. 6,204,694 which issued on Mar. 20, 2001 for "Programmable Clock Signal Generation Circuits and Methods for Generating Accurate, High Frequency Clock Signals" and which is incorporated herein by reference. The synthesis of circuit 30 results in a circuit that simulates incorrectly using the typical prior art design process described earlier because logic simulators cannot process the parallel connected tristate devices such as those contained in sub-circuits 32 and 44 of circuit 30.

The delay of circuit 30 depends upon the state of select signal Select(1). Sub-circuit or function 32 consists of an inverter 34 and seven parallel connected tristate inverters 35, 36, 37, 38, 39, 40 and 41. Select line Select(1) switches tristate inverters 35 and 36 between active and inactive states. Tristate inverters 37 and 38 are controlled by a $Logic_{13}$ Low input and, therefore, are always inactive. Tristate inverters 39, 40, and 41 are controlled by a $Logic_{13}$ High input and, therefore, are always active. Select line, Select(1), in effect, selects either the delay of three tristate inverters or that of five tristate inverters driving in parallel. Function 44 is similar in structure and operation to function 32, but has a different delay due to a different number of tristate inverters being enabled by select signal, Select(0).

Figure 4:
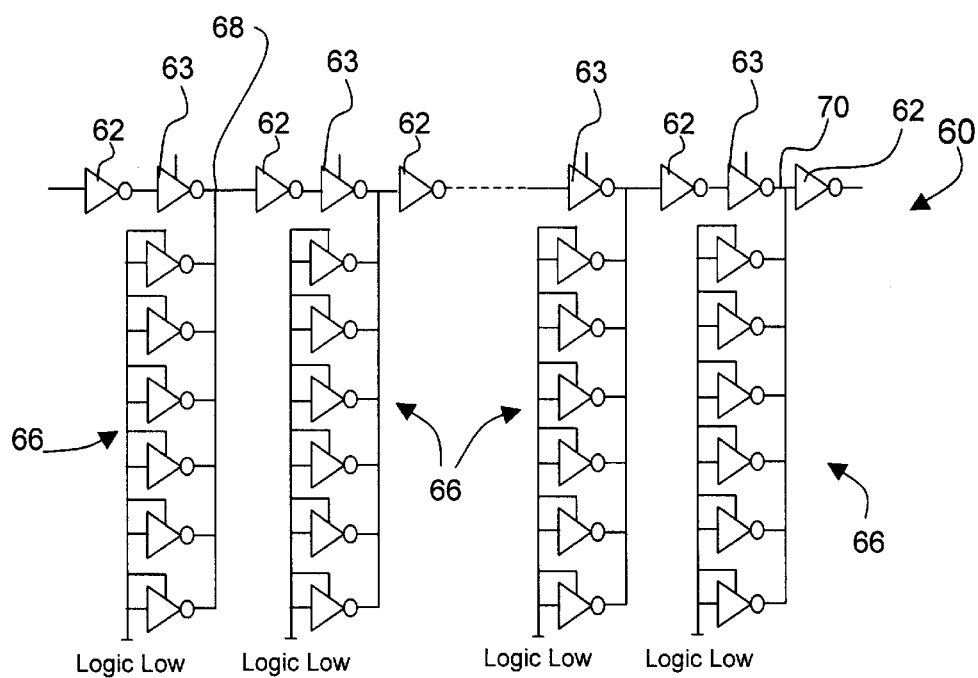
Figure 5:
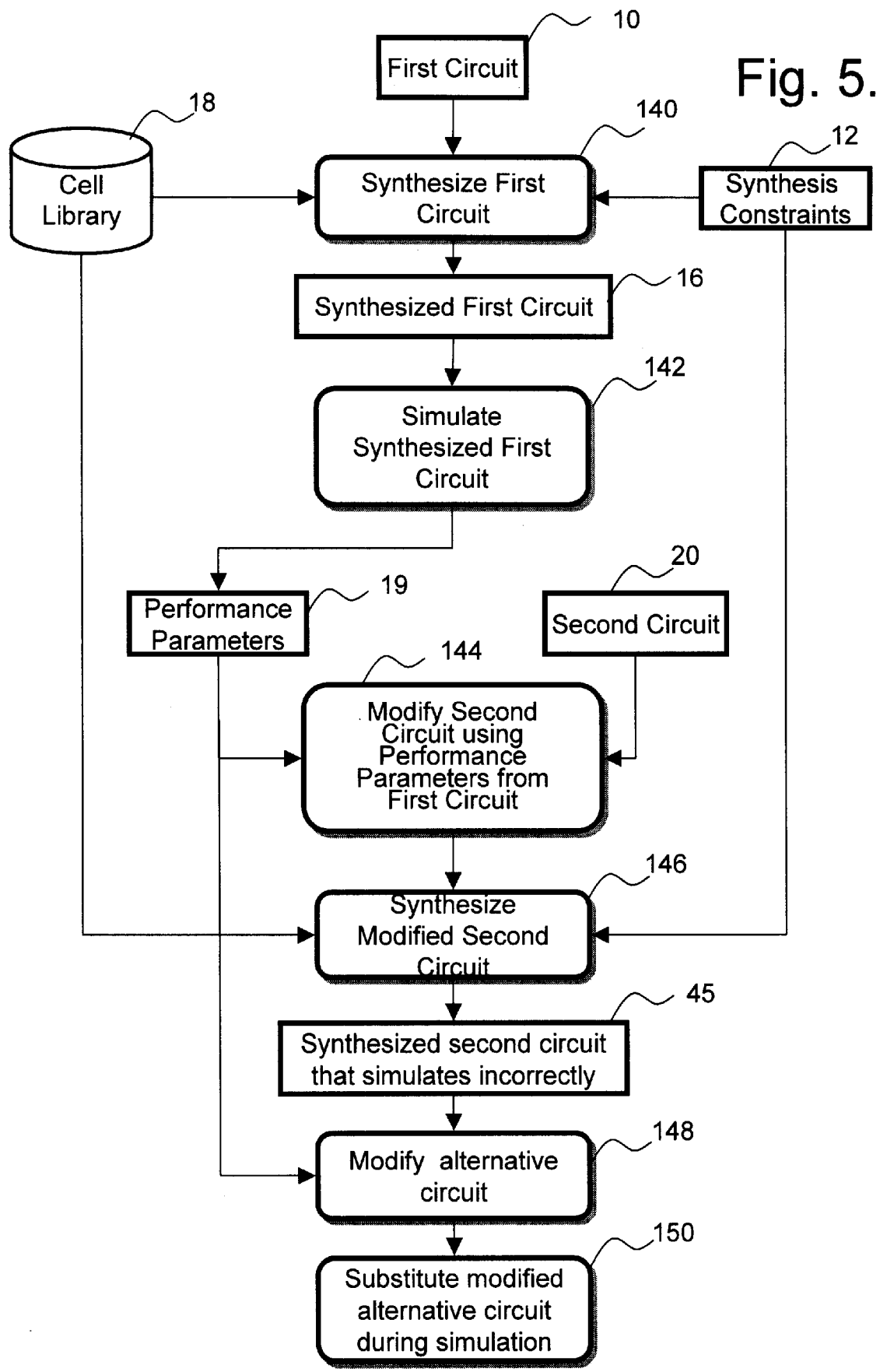
FIG. 5 is a flow chart illustrating a synthesis method according to.another embodiment of the present invention.
Figure 6:
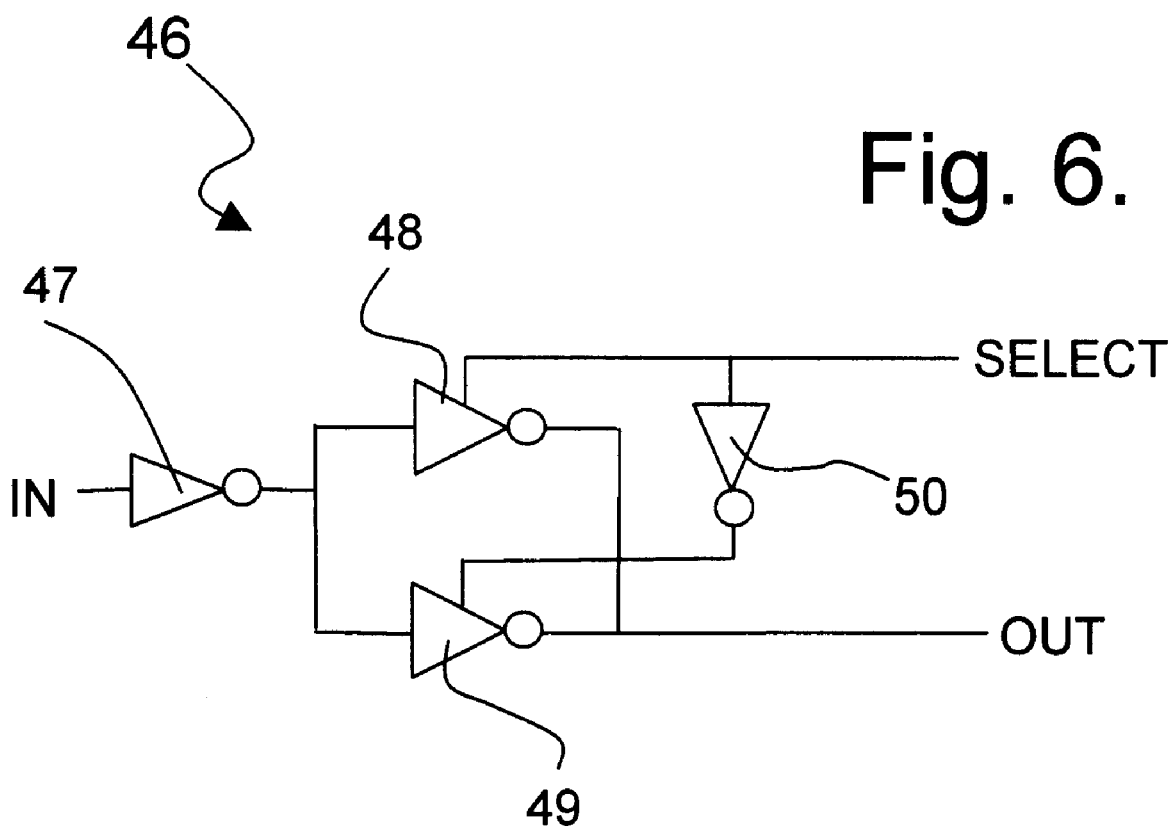
FIG. 6 illustrates a simulation model consisting of inverters and tristate inverters.

The method of FIG. 5 is used to resolve the problem of simulating circuit 30. Steps 140, 142, 144 and 146 are the same as correspondingly numbered steps in of FIG. 1. In this case, however, the synthesis of circuit 30 results in a circuit 45 that will not simulate correctly for the reasons mentioned above. In accordance with this embodiment of the method of the present invention, an alternative model 46 (FIG. 6), which simulates correctly, of sub-circuits 32 and 44 is created for use during simulation of circuit 45. Prior to simulation, the simulation model is modified (step 148) to reflect the timing characteristics and other appropriate parameters obtained by the simulation of the representative circuit in step 142. During simulation, the modified simulation model is substituted for sub-circuits 32 and 44 (step 150). FIG. 6 illustrates a simulatable model 46 of sub-circuits 32 and 44. The simulation model includes inverter 47, tristate inverters 48, and 49, and inverter 50. SELECT is the only active disable signal in the simulation model. When SELECT is high, the signal takes the path through tristate inverter 48 and, when low, the logic path is through tristate inverter 49. The delay parameters that are inserted in the simulatable model 46 are obtained by simulating first circuit 10, which will now be described with reference to FIGS. 3 and 4.

Figure 3:
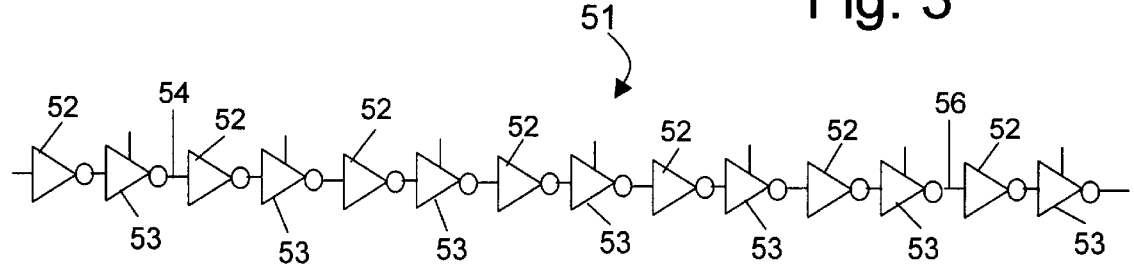
FIG. 3 and FIG. 4 are circuit diagrams of portions of a representative circuit used to determine parameters of pre-defined circuits from a hardware fabrication technology, specifically, a representative circuit for use in determining the delay and drive factor of a tristate inverter.

First circuit 10 is a high-level description of a circuit that includes constructs, or variations thereof, which are representative of constructs used in the high-level description of the second circuit 20. FIG. 3 is a circuit diagram of a first portion 51 of a representative circuit that is used in first circuit 10 in FIG. 5 to determine the delay of a tristate inverter. The tristate inverter is an example of a pre-defined circuit which is contained in a cell library of a hardware fabrication technology of interest. FIG. 4 is a circuit diagram of a second portion 60 of the representative circuit. This portion of the representative circuit is used to determine performance parameters, specifically, the drive factor, of the tristate inverter. The two portions of the circuit are described in HDL and contained in a single representative circuit HDL file.

Circuit portion 51 of FIG. 3 comprises a plurality of serially connected pairs of an inverter 52 and tristate inverter 53. The delay of the inverter pairs is measured, during simulation, at each of nodes 54 and 56 at opposite ends of a series of five inverter pairs. The delay per inverter pair is the delay at node 54 minus the delay at node 56 divided by the number of inverter pairs between the two nodes. It will be appreciated that a different number of inverter pairs may be provided between nodes 54 and 56. The first and last inverter pairs in the series of seven inverter pairs are provided to minimize effects of slew rate of an input waveform and to equalize loading on all inverter stages. Multiple inverter stages are used to minimize rounding effects of the circuit simulators.

As mentioned, circuit portion 60 in FIG. 4 is used to measure the drive factor of the tristate inverters resulting from loading with other tristate inverters under minimum and maximum load conditions and imitates the loading in functions 32 and 44 of the circuit of FIG. 2. Representative circuit portion 60 comprises a plurality of pairs of serially connected inverter 62 and tri-state inverter 63 with the output of tristate inverters 63 being connected to the combined output of a plurality of parallel connected tristate inverters 66. It will be noted that the select input of each of tristate inverters 66 is connected to a Logic_Low control input. Thus, unlike the circuit of FIG. 2, this circuit can be simulated by logic simulators. The drive factor is calculated from the delays between two nodes, such as at nodes 68 and 70, combined with values obtained from representative circuit 30 of FIG. 3.

Figure 7:
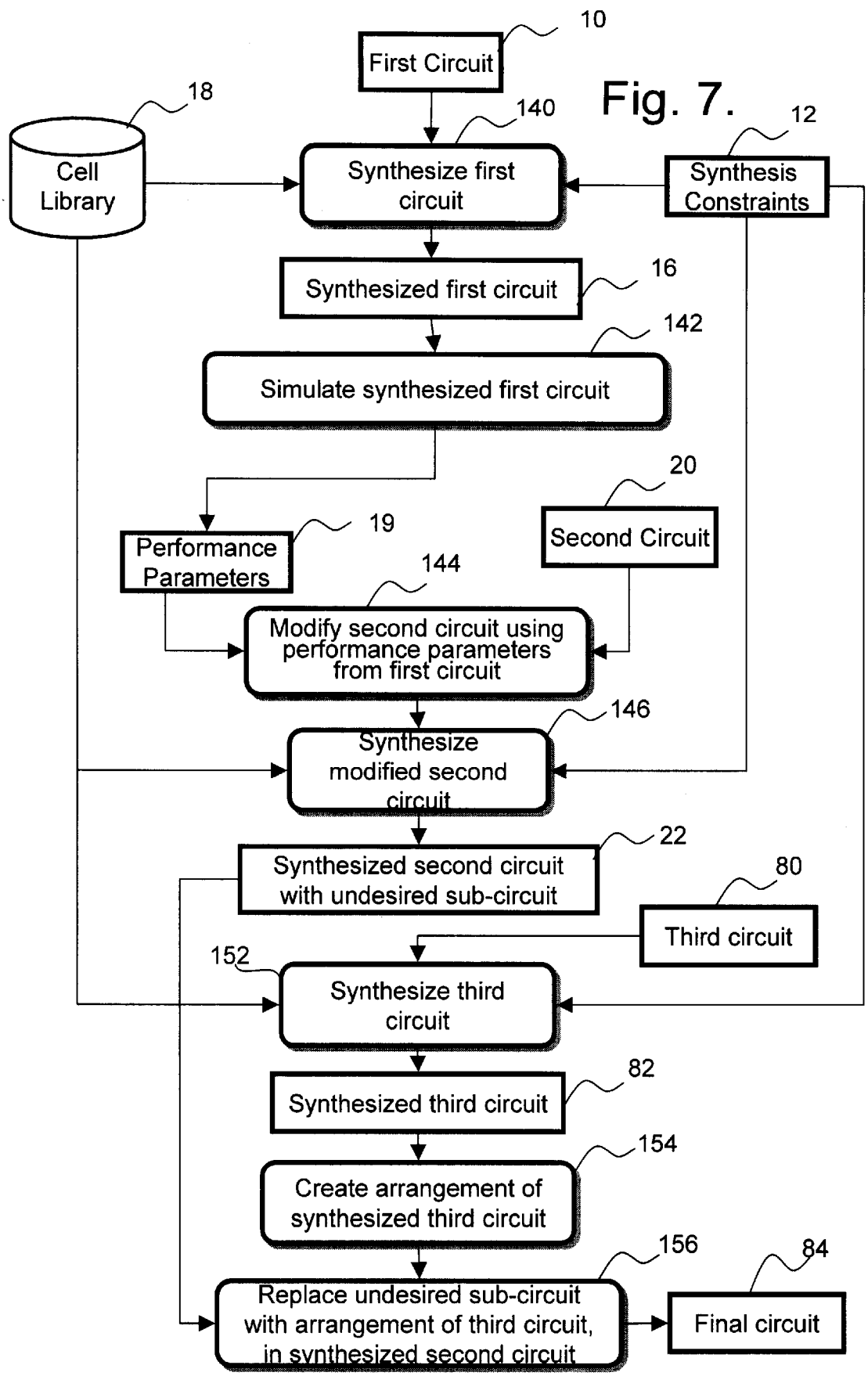
FIG. 7 is a flow chart illustrating a synthesis method according to still another embodiment of the present invention.

FIG. 7 illustrates a further embodiment of the method of the present invention. This embodiment addresses the problem of a circuit which cannot be synthesized directly. For example, the circuit may include a sub-circuit, such as an arrangement of parallel connected tristate inverters, which cannot be synthesized in the manner desired by the designer. In this embodiment of the method, steps 140, 142, 144 and 146 of the method of FIG. 1 are performed to obtain synthesized circuit 22. Circuit 22 will not be the desired circuit because of the difficulty with the troublesome sub-circuit. In accordance with this embodiment of the method, a third circuit 80 is synthesized (step 152) using cell library 18 and synthesis constraints 12 to produce a synthesized third circuit 82. Third circuit 80 may, for example, be a single tristate inverter. A circuit arrangement is then created (step 154) using synthesized third circuit 82 and loading and other information obtained during the synthesis of circuit 20. For example, the arrangement may be an arrangement of parallel connected, tristate inverters corresponding to troublesome sub-circuit 30 mentioned earlier. Synthesized circuit 22 is then modified (step 156) by replacing the undesired sub-circuit with the circuit arrangement created in step 154, resulting in final circuit 84.

The methods of FIGS. 1, 5 and 7 may be performed iteratively. For example, FIG. 8 illustrates the same method as FIG. 1, with two additional steps, steps 160 and 162. The methods of FIG. 5 and FIG. 7 may also include these steps. Step 160 involves estimating the performance of the second circuit based on the values of the performance parameters derived from the synthesis and simulation of first circuit 10. If the estimated performance is satisfactory, then the description of the second circuit is modified and synthesized as previously described. If the estimated performance is not acceptable, then step 162 is performed. Step 162 involves modifying the synthesis constraints. Steps 140, 142, 160 and 162, are repeated until the performance estimate is sufficient.

The invention contemplates storing the derived values for use at a later time in modifying and synthesizing other circuits using the stored values. The present invention contemplates a circuit design software tool which incorporates the representative circuits, simulation model, and/or various versions or arrangements of circuits 80. In the various steps of the method, synthesis is performed using commercially available synthesis software and the simulation is performed by commercially available simulation software.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth herein above are not intended to limit the breadth of the present invention, which should be inferred only from the following claims and their appropriately construed legal equivalents.

We claim:

1. A method of synthesizing a circuit, comprising:
synthesizing a high-level circuit description of a first circuit, according to synthesis constraints and a circuit implementation technology, to produce a synthesized first circuit;
simulating the synthesized first circuit to derive values of performance parameters of the circuit implementation technology;
modifying a high-level circuit description of a second circuit based on said derived values to produce a modified second circuit description; and
synthesizing the modified second circuit description, according to the synthesis constraints and the circuit implementation technology, to produce a synthesized second circuit.

2. A method as defined in claim 1, wherein, for circuit having a sub-circuit whose model does not simulate correctly, said method further including, using said derived values to modify an alternative model of said sub-circuit that does simulate correctly to produce a modified alternative model, and substituting the modified alternative model for the sub-circuit model during simulation of said circuit.

3. A method as defined.in claim 2, further including using additional predetermined high-level circuit descriptions of additional circuitry, synthesizing the additional circuitry according to the synthesis constraints and the circuit implementation technology and replacing a sub-circuit of the second synthesized circuit with an arrangement of the additional circuitry which is dependent on said derived values to create a circuit that cannot otherwise be synthesized directly.

4. A method as defined in claim 3, further including estimating the performance of the second circuit based on said derived values; and, if the estimated performance is insufficient, modifying the synthesis constraints and repeating said synthesizing a first circuit, said simulating said synthesized first circuit, and said estimating the performance, until the estimated performance is sufficient.

5. A method as defined in claim 4, further including creating a high-level description of said first circuit that includes constructs, or variations thereof, representative of constructs used in said high-level description of said second circuit.

6. A method as defined in claim 5, further including storing said derived values and, at a later time, performing said modifying a high-level circuit description of a second circuit and said synthesizing the modified second circuit description using the stored values.

7. A method as defined in claim 1, further including using additional predetermined high-level circuit descriptions of additional circuitry, synthesizing the additional circuitry according to the synthesis constraints and the circuit implementation technology and replacing a sub-circuit of the second synthesized circuit with an arrangement of the additional circuitry which is dependent on said derived values to create a circuit that cannot otherwise be synthesized directly.

8. A method as defined in claim 1, further including estimating the performance of the second circuit based on said derived values; and, if the estimated performance is insufficient, modifying the synthesis constraints and repeating said synthesizing a first circuit, said simulating said synthesized first circuit, and said estimating the performance, until the estimated performance is sufficient.

9. A method as defined in claim 1, further including creating a high-level description of said first circuit that includes constructs, or variations thereof, representative of constructs used in said high-level description of said second circuit.

10. A method as defined in claim 1, further including storing said derived values and, at a later time, performing said modifying a high-level circuit description of a second circuit and said synthesizing the modified second circuit description using the stored values.

11. A method of synthesizing a circuit having a sub-circuit whose model does not simulate correctly, comprising:

synthesizing a high-level circuit description of a first circuit according to synthesis constraints and a circuit implementation technology to produce a synthesized first circuit;

simulating the synthesized first circuit to derive values of performance parameters of the circuit implementation technology;

modifying a high-level circuit description of a second circuit based on said derived values to produce a modified second circuit description; and synthesizing the modified second circuit description according to the synthesis constraints and the circuit implementation technology to produce a synthesized second circuit;

using said derived values to modify an alternative model of said sub-circuit that does simulate correctly to produce a modified alternative model; and substituting the modified alternative model for the sub-circuit model during simulation of said circuit.

12. A method as defined in claim 11, further including estimating the performance of the second circuit based on said derived values; and, if the estimated performance is insufficient, modifying the synthesis constraints and repeating said synthesizing a first circuit, said simulating said synthesized first circuit, and said estimating the performance, until the estimated performance is sufficient.

13. A method of synthesizing a circuit that cannot be synthesized directly, comprising:

synthesizing a high-level circuit description of a first circuit according to synthesis constraints and a circuit implementation technology to produce a synthesized first circuit;

simulating the synthesized first circuit to derive values of performance parameters of the circuit implementation technology;

modifying a high-level circuit description of a second circuit based on said derived values to produce a modified second circuit description; and synthesizing the modified second circuit description according to the synthesis constraints and the circuit implementation technology to produce a second circuit;

using additional predetermined high-level circuit descriptions of additional circuitry, synthesizing the additional circuitry according to the synthesis constraints and the circuit implementation technology; and replacing a sub-circuit of the second circuit with an arrangement of the additional circuitry which is dependent on said derived values to create a circuit that cannot otherwise be synthesized directly.

14. A method as defined in claim 13, further including estimating the performance of the second circuit based on said derived values; and, if the estimated performance is insufficient, modifying the synthesis constraints and repeating said synthesizing a first circuit, said simulating said synthesized first circuit, and said estimating the performance, until the estimated performance is sufficient.

15. A program product for use in synthesizing a circuit, comprising:

a computer readable storage medium;

means recorded on said medium for synthesizing a high-level circuit description of a first circuit according to synthesis constraints and a circuit implementation technology to produce a synthesized first circuit;

means recorded on said medium for simulating the synthesized first circuit to derive values of performance parameters of the circuit implementation technology;

means recorded on said medium for modifying a high-level circuit description of a second circuit based on said derived values to produce a modified second circuit description; and means recorded on said medium for synthesizing the modified second circuit description according to the synthesis constraints and the circuit implementation technology to produce a synthesized second circuit.

16. A program product as defined in claim 15, further including means recorded on said medium for using said derived values to modify a simulatable alternative model of a sub-circuit of said second circuit that does simulate correctly to produce a modified alternative model, and for substituting the modified alternative model for the sub-circuit model during simulation of said circuit.

17. A program product as defined in claim 16, further including means recorded on said medium for using additional predetermined high-level circuit descriptions of additional circuitry, synthesizing the additional circuitry according to the synthesis constraints and the circuit implementation technology and replacing a sub-circuit of the second synthesized circuit with an arrangement of the additional circuitry which is dependent on said derived values to create a circuit that cannot otherwise be synthesized directly.

18. A program product as defined in claim 17, further including means recorded on said medium for storing said derived values for use at a later time in modifying a high-level circuit description of a second circuit and synthesizing the modified second circuit description using the stored values.

19. A program product as defined in claim 15, further including means recorded on said medium for using additional predetermined high-level circuit descriptions of additional circuitry and for synthesizing the additional circuitry according to the synthesis constraints and the circuit implementation technology and for replacing a sub-circuit of the second synthesized circuit with an arrangement of the additional circuitry which is dependent on said derived values to create a circuit that cannot otherwise be synthesized directly.

20. A program product as defined in claim 15, further including means recorded on said medium for estimating the performance of the second circuit based on said derived values; and, if the estimated performance is insufficient, for modifying the synthesis constraints and repeating the synthesis and simulation of the first synthesized circuit, estimating the performance, and modification of synthesis constraints until the estimated performance is sufficient.

21. A program product as defined in claim 15, further including means recorded on said medium for creating a high-level description of said first circuit that includes constructs, or variations thereof, representative of constructs used in said high-level description of said second circuit.

22. A program product as defined in claim 21, further including means recorded on said medium for estimating the performance of the second circuit based on said derived values; and, if the estimated performance is insufficient, modifying the synthesis constraints and repeating synthesizing the first circuit, said simulating the synthesized first circuit, said estimating the performance and modification of the synthesis constraints until the estimated performance is sufficient.

23. A program product as defined in claim 15, further including means recorded on said medium for storing said derived values on a computer readable storage medium for use at a later time in modifying a high-level circuit description of a second circuit and in synthesizing the modified second circuit description using the stored values.

24. A program product as defined in claim 23, further including means recorded on said medium for creating a high-level description of said first circuit that includes constructs, or variations thereof, representative of constructs used in said high-level description of said second circuit.

25. A program product of synthesizing a circuit having a sub-circuit whose model does not simulate correctly, comprising:

a computer readable storage medium;

means recorded on said medium for synthesizing a high-level circuit description of a first circuit according to synthesis constraints and a circuit implementation technology to produce a synthesized first circuit;

means recorded on said medium for simulating the synthesized first circuit to derive values of performance parameters of the circuit implementation technology;

modifying a high-level circuit description of a second circuit based on said derived values to produce a modified second circuit description; and means recorded on said medium for synthesizing the modified second circuit description according to the synthesis constraints and the circuit implementation technology to produce a synthesized second circuit;

means recorded on said medium for using said derived values to modify an alternative model of said sub-circuit that does simulate correctly to produce a modified alternative model; and means recorded on said medium for substituting the modified alternative model for the sub-circuit model during simulation of said circuit.

26. A program product as defined in claim 25, further including means recorded on said medium for estimating the performance of the second circuit based on said derived values; and, if the estimated performance is insufficient, modifying the synthesis constraints and repeating synthesizing of the first circuit, simulating the resulting synthesized first circuit, estimating the performance, and modifying the synthesis constraints until the estimated performance is sufficient.

27. A program product for synthesizing a circuit that cannot be synthesized directly, comprising:

a computer readable storage medium;

means recorded on said medium for synthesizing a high-level circuit description of a first circuit according to synthesis constraints and a circuit implementation technology to produce a synthesized first circuit;

means recorded on said medium for simulating the synthesized first circuit to derive values of performance parameters of the circuit implementation technology;

modifying a high-level circuit description of a second circuit based on said derived values to produce a modified second circuit description; and means recorded on said medium for synthesizing the modified second circuit description according to the synthesis constraints and the circuit implementation technology to produce a second circuit;

means recorded on said medium for using additional predetermined high-level circuit descriptions of additional circuitry, synthesizing the additional circuitry according to the synthesis constraints and the circuit implementation technology; and means recorded on said medium for replacing a sub-circuit of the second circuit with an arrangement of the additional circuitry which is dependent on said derived values to create a circuit that cannot otherwise be synthesized directly.

28. A program product as defined in claim 27, further including estimating the performance of the second circuit based on said derived values; and, if the estimated performance is insufficient, modifying the synthesis constraints and repeating said synthesizing a first circuit, said simulating said synthesized first circuit, and said estimating the performance, until the estimated performance is sufficient.

* * * * *